United States Patent
Phillips et al.

(10) Patent No.: US 9,589,789 B2
(45) Date of Patent: Mar. 7, 2017

(54) COMPOSITIONS OF LOW-K DIELECTRIC SOLS CONTAINING NONMETALLIC CATALYSTS

(71) Applicant: SBA Materials, Inc., San Jose, CA (US)

(72) Inventors: Mark L. F. Phillips, Albuquerque, NM (US); Travis Savage, Albuquerque, NM (US)

(73) Assignee: SBA Materials, Inc., Albuquerque, NM (US)

(*) Notice: Subject to any disclaimer, the term of this patent is extended or adjusted under 35 U.S.C. 154(b) by 0 days.

(21) Appl. No.: 14/976,995

(22) Filed: Dec. 21, 2015

(65) Prior Publication Data

US 2016/0111275 A1  Apr. 21, 2016

Related U.S. Application Data

(63) Continuation of application No. 14/069,352, filed on Oct. 31, 2013, now abandoned.

(60) Provisional application No. 61/720,960, filed on Oct. 31, 2012.

(51) Int. Cl.
| | |
|---|---|
| *H01L 21/00* | (2006.01) |
| *C08J 9/00* | (2006.01) |
| *H01L 21/02* | (2006.01) |
| *C09D 183/04* | (2006.01) |
| *H01L 21/768* | (2006.01) |
| *C08G 77/18* | (2006.01) |

(52) U.S. Cl.
CPC ...... *H01L 21/02126* (2013.01); *C08J 9/0042* (2013.01); *C09D 183/04* (2013.01); *H01L 21/02203* (2013.01); *H01L 21/02211* (2013.01); *H01L 21/02216* (2013.01); *H01L 21/02282* (2013.01); *H01L 21/76828* (2013.01); *C08G 77/18* (2013.01); *C08J 2300/00* (2013.01)

(58) Field of Classification Search
None
See application file for complete search history.

(56) References Cited

U.S. PATENT DOCUMENTS

| | | | |
|---|---|---|---|
| 6,558,747 B2 | 5/2003 | Nakata | |
| 6,630,406 B2 | 10/2003 | Waldfried | |
| 6,800,330 B2 | 10/2004 | Hayashi | |
| 6,919,636 B1 | 7/2005 | Ryan | |
| 7,128,976 B2 | 10/2006 | Hayashi | |
| 7,176,245 B2 | 2/2007 | Stucky | |
| 2002/0042210 A1* | 4/2002 | Mandal | C01B 33/16 438/780 |
| 2002/0045693 A1 | 4/2002 | Hayashi | |
| 2003/0087042 A1 | 5/2003 | Murakami | |
| 2003/0099843 A1 | 5/2003 | Aoki | |
| 2003/0207595 A1 | 11/2003 | Ralamasu | |
| 2004/0170760 A1 | 9/2004 | Meagley | |
| 2005/0089642 A1 | 4/2005 | Adams | |
| 2005/0196974 A1 | 9/2005 | Weigel et al. | |
| 2005/0214674 A1 | 9/2005 | Sui | |
| 2006/0006541 A1 | 1/2006 | Tsuchiya | |
| 2006/0078676 A1 | 4/2006 | Lukas | |
| 2006/0216952 A1 | 9/2006 | Bhanp | |
| 2006/0249818 A1 | 11/2006 | Peterson | |
| 2006/0276041 A1 | 12/2006 | Uchikura | |
| 2007/0099005 A1 | 5/2007 | Leung | |
| 2008/0011987 A1 | 1/2008 | Arao | |
| 2009/0017272 A1* | 1/2009 | Phillips | H01L 21/02123 428/195.1 |
| 2011/0135847 A1 | 6/2011 | Phillips | |

OTHER PUBLICATIONS

International Search Report and Written Opinion issued in connection with PCT Application No. PCT/US2013/067903.

* cited by examiner

*Primary Examiner* — Kara Boyle
(74) *Attorney, Agent, or Firm* — Berliner & Associates

(57) ABSTRACT

A sol composition for producing a porous low-k dielectric material is provided. The composition can include at least one silicate ester, a polar solvent, water, an acid catalyst for silicate ester hydrolysis, an amphiphilic block copolymer surfactant, and a nonmetallic catalyst that reduces dielectric constant in the produced material. The composition can further include a metallic ion at a lower parts-per-million concentration than the nonmetallic catalyst, and/or the composition can further include a cosolvent. A method of preparing a thin film on a substrate using the sol composition is also provided.

21 Claims, 1 Drawing Sheet

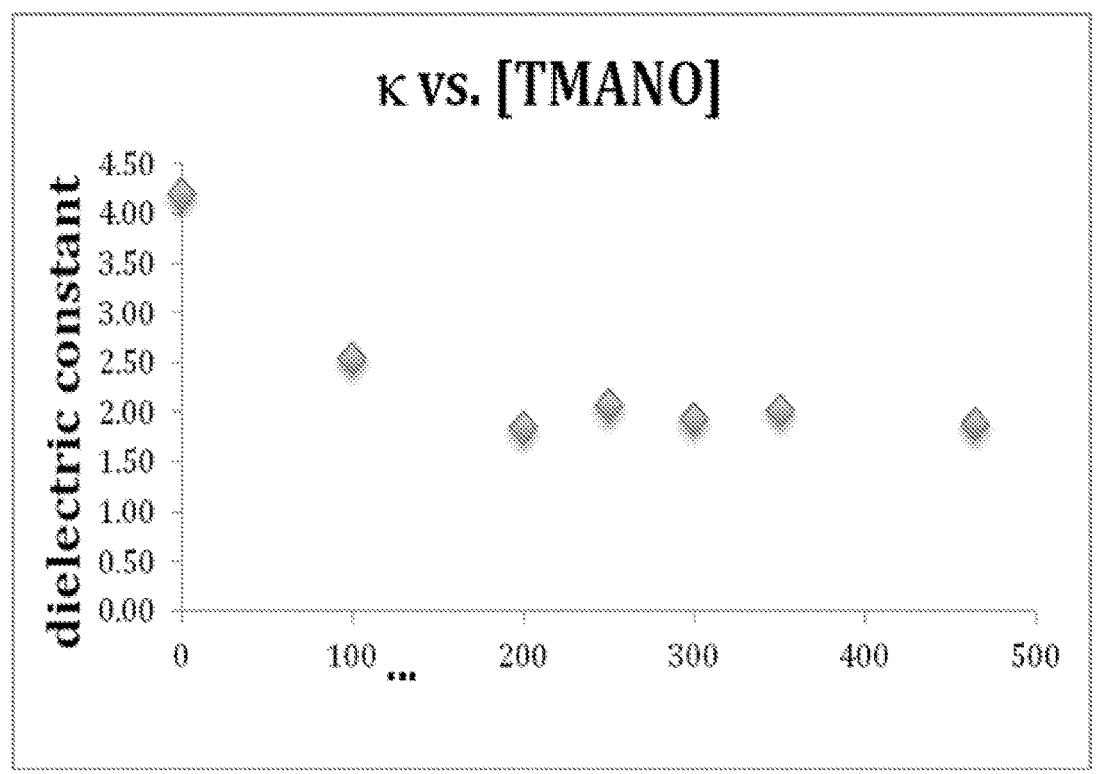

COMPOSITIONS OF LOW-K DIELECTRIC SOLS CONTAINING NONMETALLIC CATALYSTS

CROSS-REFERENCE TO RELATED APPLICATIONS

This application is a continuation of application Ser. No. 14/069,352, filed on Oct. 31, 2013, which claims priority to Provisional Application No. 61/720,960, filed on Oct. 31, 2012, all of which are incorporated by reference herein.

BACKGROUND

Field of the Invention

The invention relates to compositions for producing porous low-k dielectric films.

Related Art

For certain purposes it is desirable to use materials with low dielectric constants. The manufacture of interlayer dielectric (ILD) semiconductor thin films is typically carried out by depositing the desired thin film on a surface such as a semiconductor substrate. For some applications it is required that the dielectric constant of an ILD film be less than 2.5. One common method of depositing thin films is by spin-on deposition. During spin-on deposition a liquid precursor to the thin film is applied to a semiconductor wafer, and either during deposition or thereafter the wafer is rotated at sufficiently high speed to thin and even the layer of precursor solution. During and after the rapid spinning step the solvents are permitted to evaporate, leaving a dried film of dielectric material.

Spin-on deposition has an advantage over vapor-phase deposition processes in that pore size and geometry may be controllable via a self assembly process in which a detergent that acts as a porogen (or "template") organizes upon drying and causes the condensed material to yield 2 discrete phases, a silica-rich phase and an organic phase. The organic phase is subsequently removed through an annealing process, leaving behind a porous glassy structure.

It is generally the case that the self-assembly of the detergent phase requires a metal ion catalyst in low concentration (1-100 ppm). If no metal is present the self-assembly process is interrupted and the film that results from condensation and anneal is not sufficiently porous. Consequently the dielectric constant of such a film is higher than desired, and approaches that of condensed silica (~4).

Alkali metal ions, especially $Na^+$ and $K^+$, are highly effective. However, these ions can contaminate silicon during the semiconductor manufacturing process and cause undesired changes in the performance of electronic devices thusly contaminated. Cesium ($Cs^+$) is an effective substitute for $Na^+$ and $K^+$ and promotes the self assembly of the surfactant template.

However, introducing metal ions into a semiconductor manufacturing facility is something that many companies want to avoid even in cases where there is no known problem associated with Cs in the manufacturing process.

SUMMARY

In one aspect, a sol composition for producing a porous low-k dielectric material is provided. The composition can comprise or consist of: at least one silicate ester, a polar solvent, water, an acid catalyst for silicate ester hydrolysis, an amphiphilic block copolymer surfactant, and a nonmetallic catalyst that reduces dielectric constant in the produced material. In some cases where a metal ion is desired, the composition can further include a metallic ion, which can be an alkali metal ion, at a lower parts-per-million concentration than the nonmetallic catalyst. In some embodiments, the composition can further include a cosolvent. The addition of the nonmetallic catalyst to the sol composition can produce a film having a lower dielectric constant value upon annealing than a sol that lacks a nonmetallic catalyst but is otherwise identical. In particular embodiments of the sol composition, the at least one silicate ester can be tetraethyl orthosilicate, the polar solvent can be a $C_{1-4}$ alcohol, and the amphiphilic block copolymer surfactant can be a poly(ethylene oxide)-poly(propylene oxide)-poly(ethylene oxide) polymer.

The nonmetallic catalyst can comprise or consist of constituent atoms selected from the group consisting of B, C, N, O, H, Si, P, and a combination thereof.

In some embodiments, the nonmetallic catalyst can comprise or consist of a cation, which can be a stabilized carbocation such as tropylium or triphenylmethyl, or the like. In particular embodiments, the cation can be a stabilized carbocation such as a triarylmethane dye, which can be crystal violet or malachite green, or other cations such as methyl viologen, diquat, choline nitrate, or a zwitterion such as glycine betaine. The inventors have found that quaternary ammonium compounds such as tetramethylammonium can be used, but have found that other cations and zwitterions are more effective.

In some embodiments, the nonmetallic catalyst can comprise or consist of a zwitterion, which can be 1,3 dimethyimidazolium-2-carboxylate, glycine betaine, cyameline, arginine, or Reichardt's dye. The zwitterion can have an isoelectric point that is in the range of about 2 to about 9.

In the composition, the nonmetallic catalyst can be: stable to at least 130° C.; at a concentration of between 1 ppm-20,000 ppm, or between 10 ppm-2,000 ppm; stable in water and/or an alcohol at a temperature≥80° C., which can be up to 1000° C.; stable in the presence of an organic silicate in solution; or any combination thereof.

In embodiments where the nonmetallic catalyst can comprise or consist of constituent atoms selected from the group consisting of B, C, N, O, H, Si, P, and a combination thereof, the nonmetallic catalyst in some embodiments can comprise or consist of a quaternary ammonium ion in combination with an anionic group; or can comprise or consist of a tertiary amine oxide. In particular embodiments, the quaternary ammonium ion in combination with an anionic group can be glycine, betaine, arginine, cyameline, 1,3-dimethylimidazolium 2-carboxylate, or nicotinic acid, and the tertiary amine oxide can be trimethylamine N-oxide (TMANO), pyridine N-oxide, 4-aminopyridine N-oxide, quinoline N-oxide, or DABCO-DNODP.

In embodiments where the nonmetallic catalyst can comprise or consist of constituent atoms selected from the group consisting of B, C, N, O, H, Si, P, and a combination thereof, the nonmetallic catalyst in some embodiments can comprise or consist of: a neutral molecule comprising a pronounced dipole; or a neutral molecule comprising a nitrogen bonded to an electron withdrawing atom or group. In particular embodiments, the neutral molecule comprising a pronounced dipole can be 4-nitroaniline, 4-aminobenzonitrile, 4-pyridinecarbonitrile, or Michler's ketone, and the neutral molecule comprising a nitrogen bonded to an electron withdrawing atom or group can be $NH_2CN$ (cyanamide), a salt of the $N(CN)_2$-(dicyanamide) anion, ammonium dinitramide (ADN), or chloramine-T.

In another aspect, a method of preparing a thin film on a substrate is provided. The method can comprise or consist of treating a substrate by depositing a sol composition containing a nonmetallic catalyst onto the substrate, and baking and annealing the treated substrate to form a film, where the sol composition is any sol composition described herein.

BRIEF DESCRIPTION OF THE DRAWINGS

For a more complete understanding of the present invention, reference is now made to the following descriptions taken in conjunction with the accompanying drawings, in which:

FIG. 1 is a plot of dielectric constant vs. trimethylamine N-oxide dopant concentration in the 538 series of low-k test sols.

DETAILED DESCRIPTION

The following application is incorporated by reference herein: U.S. Provisional Patent Application No. 61/720,960, filed on Oct. 31, 2012.

The inventors recognize that replacing metal ions with organic materials can address concerns about metal ions in semiconductor fabrication facilities. For example, catalysts that would replace Cs can be limited in composition to the elements C, H, O, N, Si, B, and P. In some cases it may be desirable to partially replace the Cs with such a catalyst so as to reduce the amount of Cs required in the sol, if complete elimination of the Cs catalyst is not required.

The present invention can avoid the potential for metal contamination by providing a spin-on dielectric of novel composition. In embodiments, a sol is provided that yields a low k dielectric film without the use of metal ion(s) that remain in the film after it is annealed. In turn this provides a spin-on dielectric that can have a total metal concentration that is less than 1 ppm (parts per million), and can be less than 50 ppb (parts per billion), with less than 5 ppb from any individual metallic contaminant.

In one embodiment, a fluid colloidal solution is provided comprising a silica source, a polar solvent, water, an acid catalyst, an amphiphilic block copolymer surfactant, a cosolvent, and a nonmetallic catalyst. In another embodiment, a sol is provided comprising an orthosilicate ester, which can be alone or in combination with an alkylated silicate ester, a polar solvent, water, an acid catalyst, an amphiphilic block copolymer surfactant, a cosolvent, and a catalyst whose constituent elements are limited to one or more of the following: C, H, O, N, Si, B, and P.

In an embodiment, a novel spin-on dielectric composition is provided. The composition is formed of a sol having components to produce a lyotropic solution as the solvents in the sol are removed. This lyotropic solution may or may not impart order to the sol as it dries, but has the effect of producing a uniform pore size distribution upon removal of the surfactant template. The sol contains several components that affect the ability of the material to be uniformly coated onto a substrate, or influence the film dielectric constant after the template is removed. These components comprise:
 a silicate ester component;
 a polar solvent;
 water;
 an acid catalyst;
 an amphiphilic block copolymer surfactant, alternately known as "template" or "detergent";
 a nonmetallic catalyst that enables the self-organization of the surfactant as the sol dries onto the desired substrate;
 an optional cosolvent.

In order to provide a sol with reduced metal content it is useful to remove ionic contaminants from the surfactant before it is incorporated into the sol. For example, one method to reduce contaminants involves dissolving a surfactant in a mixture of 80 wt. % n-propanol and 20% water, filtering the solution, and eluting the filtered solution through an ion exchange column containing an appropriate protonated cation exchange resin (such as Supelco MTO-Dowex Monosphere 650C UPW). The silicate ester, polar solvent, water, acid catalyst, amphiphilic block copolymer and cosolvent components have been described in detail in U.S. patent application Ser. Nos. 12/157,830 and 13/010,573, which are incorporated by reference herein.

The silicate ester component can be tetraethyl orthosilicate (TEOS) alone, or one or more than one alkylated silicate ester, or a combination of TEOS with one or more than one alkylated silicate ester. The alkylation can be terminal, e.g., one or more alkyl groups can be substituted for alkoxy groups. Examples of alkylated silicate esters include $CH_3$—$Si(OR)_3$, $CH_2$=CH—$Si(OR)_3$, $(CH_3)_2$—$Si(OR)_2$, and the like. Alkyl groups can also bridge silicon atoms. Examples include $(RO)_3Si$—$CH_2$—$Si(OR)_3$ (MBTE), $(RO)_3Si$—$CH_2$—$CH_2$—$Si(OR)_3$ (EBTE), $(RO)_3Si$—CH=CH—$Si(OR)_3$ (VBTE), $(RO)_3Si$—$C(=CH_2)$—$Si(OR)_3$, HC—$(Si(OR)_3)_3$, and the like.

Other examples of silicate esters include alkylated silicate esters such as methyltriethoxysilane (MTES), ethyltriethoxysilane (ETES) or vinyltriethoxysilane (VTES), methylene bis(triethoxysilane) (MBTE) or dimethyl dimethoxysilane (DMDS); esters of silicic acid or alkyl-silicic acid other than ethyl, such as methyl, propyl or butyl; silicones such as ethoxy-terminated poly(dimethylsiloxane); phenylated silicate esters, alkylated or phenylated silicate esters wherein the alkene, alkane, or phenyl substituent contains a thiol, amino, halide, or hydroxyl group, or other desired moiety; methoxy-terminated esters such as methyltrimethoxysilane, tetramethoxysilane and methoxy-teminated poly(dimethylsiloxane).

The ester (OR) groups can be methoxy-, ethoxy-, or isopropoxysilyl esters. Other ester groups can be effective.

In particular embodiments, the silicate ester component can comprise or consist of: bis(triethoxysilyl)ethane; 1,1,2-tris(triethoxysilyl)ethane; tris(triethoxysilyl)methane; TEOS; MTES; MBTE; phenyltriethoxysilane (PTES); or any combination thereof.

The polar solvent is typically a low molecular weight alcohol such as methanol, ethanol, or isopropanol. A $C_{1-4}$ alcohol can be used. Other solvents such as acetone or acetonitrile can be effective. Combinations of polar solvents are also contemplated.

The $H_2O/Si$ ratio affects film modulus and sol pot life. Particular embodiments include $H_2O/Si$ mole ratios between 3 and 8, and more particularly 6.

The acid catalyst assists the hydrolysis of the silicate ester groups. Effective acids include, but are not limited to, nitric, phosphoric, and organic acids such as glycolic, 2-oxomalonic, squaric, crotonic, and rhodizonic acids. Combinations of acid catalysts are also contemplated, such as combination of nitric acid with an organic acid.

The polymeric surfactant is typically a block copolymer incorporating hydrophilic (e.g., polyethylene oxide) and hydrophobic (e.g., alkyl chains or polypropylene oxide) regions. Examples include, but are not limited to, triblock copolymer surfactants that are poly(ethylene oxide)-poly(alkylene oxide)-poly(ethylene oxide) polymers where the alkylene oxide moiety has at least three carbon atoms. These would include poly(ethylene oxide)-poly(propylene oxide)-poly(ethylene oxide) polymers such as BASF Pluronic P104. Other polymer surfactants that are effective include polyoxyethylene alkyl ethers; in some embodiments, the polymer surfactant is polyethylene glycol (n~20) octadecyl ether. Other examples of amphiphilic copolymer surfactants are the amphiphilic copolymers described in Stucky et al. U.S. Pat. No. 7,176,245, which is incorporated by reference herein. In particular embodiments, the surfactant is electrically neutral and decomposes at a low temperature, such as 250° C.-500° C. A surfactant can be included at concentrations from 2-10% w/v, with typical concentrations varying from 4-9%.

The cosolvent can improve the quality of the spun dielectric film and control viscosity. A cosolvent has a vapor pressure that is different from, and generally lower than the polar solvent. Examples of the cosolvent include, but are not limited to, glycol ethers such as diethylene glycol monoethyl ether, dipropylene glycol monomethyl ether, propylene glycol propyl ether, and diglyme; esters such as ethyl lactate, propylene glycol methyl ether acetate, and ethylene carbonate; ketones such as acetone and ethyl acetoacetate; highly polar solvents such as acetonitrile, propylene carbonate, and N,N-dimethyl formamide; halogenated solvents such as trichloroethylene; hydrocarbon solvents such as No. 2 diesel fuel and turpentine; and combinations thereof. In some embodiments, the cosolvent can be a monomethyl or monopropyl ether of dipropylene glycol and/or diethylene glycol monoethyl ether. Combinations of cosolvents are also contemplated.

The nonmetallic catalyst can be incorporated at a concentration of <5% by weight of the components of the sol to yield a film having a dielectric constant of <5, or a dielectric constant between 1.5 to 3, upon condensation and curing, with the catalyst capable of performing this function in the absence of a metallic catalyst (such as Na, K, or Cs). Combinations of nonmetallic catalysts are also contemplated. The catalyst can be a compound or a salt of a compound. Although not wishing to be bound by the following idea, the inventors believe the nonmetallic catalyst enables the self-organization of the surfactant as the sol dries onto the desired substrate.

Based on the preferences of the electronics industry, the elemental composition of a nonmetallic catalyst can be one or more of the following: C, H, O, N, Si, B, and P.

It is observed that nonmetallic catalysts that are effective at promoting the formation of low-k dielectric films have certain characteristics in common: they are either capable of being substantially ionized in aqueous solution or possess a strong electric dipole or a formal charge on one or more atoms; and they are stable with respect to the other sol components (in particular, to water, alcohols, and the acid catalyst) and are thermally stable to at least 130° C., a typical temperature at which the freshly spun dielectric film is dried and condensed.

Examples of nonmetallic catalysts include, but are not limited to:

zwitterions such as glycine betaine (trimethylglycine), Reichardt's dye, 1,3;

dimethylimidazolium-2-carboxylate and arginine phosphate;

choline phosphate and choline nitrate;

cyameline;

tetramethylammonium nitrate;

methylviologen dinitrate;

diquat dinitrate;

nitrogen-containing heterocycles and salts thereof, such as nicotine, piperidine, piperazine, morpholine, quinuclidine, diazabicyclo[2.2.2]octane (DABCO), pyridine, pyrrole, picoline, collidine, imidazole, 1-methylimidazole, triazole, 5-aminotetrazole, piperidine, morpholine, N-methylmorpholine, N-methylpiperidine, 4-dimethylaminopyridine, pyrrolidine, N-methylpyrrolidine, 1,8-bis(dimethylamino)naphthalene, 1,8-Diazabicycloundec-7-ene, 1,5-Diazabicyclo[4.3.0]non-5-ene, and 1,5,7-Triazabicyclo[4.4.0]dec-5-ene tropylium nitrate;

triphenylmethyl (trityl) nitrate;

1,3 dimethylimidazolium methylphosphate;

protonated amine salts, such as trimethylammonium nitrate;

N-oxides of tertiary amines, such as trimethylamine N-oxide, pyridine N-oxide, 4-cyanopyridine N-oxide, 4-nitropyridine N-oxide, quinoline N-oxide, isoquinoline N-oxide, 4-picoline N-oxide, DABCO di-N-oxide diperoxide (DABCO DNODP), N-methylmorpholine N-oxide, N-methylpiperidine N-oxide, N-methylpyrrolidine N-oxide, quinuclidine N-oxide, 4-dimethylaminopyridine N-oxide, 1,8-bis(dimethylamino)naphthalene N, N-dioxide;

p-nitroaniline;

4-aminopyridine-N-oxide;

4-aminobenzonitrile;

4-cyanopyridine;

triarylmethane dyes such as crystal violet, basic fuchsin, malachite green as nonhalide salts such as bicarbonate, nitrate or phosphate;

cyanamide ($NH_2CN$);

dicyanamide salts such as choline dicyanamide or guanidine dicyanamide or 1-ethyl-3-methyl imidazolium dicyanamide;

ammonium dinitramide;

Michler's ketone;

tetraphenylphosphonium and triphenylmethyl phosphonium salts;

boric acid and triethyl borate;

guanidine salts such as guanidine nitrate, aminoguanidine bicarbonate, tetramethylguanidine cyanurate, and triaminoguanidine nitrate.

Catalysts in particular embodiments can be quaternary ammonium ions, betaines, tertiary amine oxides, or donor-acceptor pairs separated by an aromatic ring, such as p-nitroaniline and 4-cyanopyridine. In certain embodiments, the catalyst can be trimethylglycine (glycine betaine), choline nitrate, trimethylamine N-oxide, N-methylmorpholine N-oxide, or 4-aminobenzonitrile.

This list is intended to illustrate the range of catalysts that are known to be effective and is not an exclusive list. Moreover, it is possible to obtain better κ reduction performance by combining more than one catalyst; some examples of these combinations are illustrated in the Examples.

A wafer may be coated using a manual or automated spin coater, and the sol may be dispensed statically (i.e., with the wafer not rotating) but is preferably dispensed dynamically, i.e., with the wafer rotating. The rotation speed for the spin cycle depends on the desired film thickness and thickness uniformity, wafer diameter, type of wafer chuck, and exhaust condition of the spin bowl. The films may be effectively spun at speeds between 500 and 4000 rpm, though it is generally advantageous to use a dilution that will yield the desired film thickness at a spin speed between 1000 and 2000 rpm.

In general, the spun films can be subjected to a low temperature "softbake" at a temperature between 80° C. and 250° C. for between 2 min. and 16 hr. with shorter times more desirable for increasing wafer throughput and longer times for increasing the modulus of the final product. Following soft bake, the coated wafers may be annealed immediately, though wafers may be stored indefinitely following soft bake if it has been done at a sufficient temperature (at least 90° C., more preferably at least 120° C.).

Films can be annealed at temperatures between 200 and 500° C., more particularly between 350 and 425° C. While films may be annealed in air, this is generally incompatible with copper damascene processing since the copper will be oxidized. Films may be annealed in vacuum, nitrogen or argon, or forming gas (hydrogen diluted with $N_2$ or Ar to approx. 5% or less by volume). Films may be annealed in several atmospheres, including but not limited to, vacuum, $N_2$, Ar, He, mixtures of inert gases, water vapor entrained in an inert carrier gas such as $N_2$, $CO_2$, $H_2$, and forming gas ($H_2$ entrained in inert gas). Gas mixtures containing oxygen at a partial pressure exceeding 0.2 bar are generally avoided due to excessive oxidation of the film.

Films may be annealed in the absence of an illumination source. Optionally, they may be annealed in the presence of ultraviolet (UV) illumination at a wavelength or wavelengths between 170 and 365 nm. This can have the effect of reducing k and increasing Young's modulus. Films are still be heated at 250-450° C. during illumination. Anneal atmosphere are consistent with the wavelengths chosen; shorter wavelengths (in particular less than 190 nm) will use vacuum or He or mixtures of He and $H_2$.

The present invention may be better understood by referring to the accompanying examples, which are intended for illustration purposes only and should not in any sense be construed as limiting the scope of the invention. In the examples, the terms "catalyst" and "dopant" may be used interchangeably.

EXAMPLE 1

A low-k dielectric sol was prepared with a nonmetallic catalyst follows: 2.04 g methylene bis(triethoxysilane), 5.00 g tetraethyl orthosilicate, and 5.35 g methyltriethoxysilane are mixed with 14.6 g ethanol. After agitation, 6.95 g of a 0.01 N solution of nitric acid in purified water is added; the mixture is then shaken and heated to 40° C. for 1 hr. A 10 g aliquot from this sol base is used to dissolve 0.7 g of BASF Pluronic p104 from which all ionic contaminants have been already removed. To this solution is added 0.075 g of a 1% w/w ethanolic solution of 1,3-dimethylimidazolium 2-carboxylate.

After agitation the mixture is allowed to stand for 1 hr, after which 3.5 g dipropylene glycol methyl ether (cosolvent) is added. The sol is once again mixed, then filtered prior to use.

To test this as a dielectric sol, a portion is dispensed onto a piece of silicon which is spun between 1000 and 2000 rpm for 1-2 minutes. This results in a dielectric film on the surface of the silicon piece. The silicon piece is then baked at 150° C. for 2 minutes, then annealed at 475° C. for 30 minutes in an inert or reducing atmosphere, e.g., $N_2$ or forming gas ($N_2/H_2$) to anneal the dielectric film to densify and stabilize the film. Alternatively, the dielectric film can be annealed using a combination of temperature and uv photons. Following anneal the thickness and capacitance of the oxide film are measured. Typical k values for the film made from the above recipe range from 2.1-2.2.

The relative effectiveness of a particular catalyst may be measured by preparing otherwise identical sol recipes with a certain concentration of catalyst, and measuring the value of the dielectric constant of the film that results once the sol is spun onto a silicon substrate, dried, and annealed. Cesium is a useful benchmark to which nonmetallic catalysts may be compared. Table I shows a list of 7 catalysts tested in two types of sols, and the dielectric constant values that resulted. Data for Cs are included for comparison. It is noted that all 7 catalysts were as effective as Cs in the "WL145" sol, which contains a low ratio of methylene bis(triethoxysilane) or "MBTE" to other silanes. However, the catalysts tested in Table 1 were generally less effective than Cs at making low-k films from "WL301" sols, which contains a high ratio of MBTE to other silanes; moreover, there is some differentiation between the 7 catalysis as to their effectiveness. The dielectric constant values were determined with a MDC mercury probe station using front-to-front contact with Hg dot and ring electrodes; capacitance was measured with a HP 4275A LCR meter at 1 MHz. In Table 1, examples of low-k dielectric sols made with nonmetallic catalysts are shown. Performance as measured by dielectric constant is measured with respect to Cs+ ion in 2 test sols, WL145 and WL301, which possess different silane ratios.

TABLE 1

| sol base | sol type | MBTE, g | TEOS, g | MTES, | HNO3, 0.01N, g | EtOH, g | net wt., g |
|---|---|---|---|---|---|---|---|
| Mp512-1 | WL145 | 2.45 | 6 | 6.42 | 8.34 | 17.52 | 40.73 |
| Mp512-2 | WL301 | 15.33 | 0 | 2.67 | 9.97 | 14.49 | 42.36 | silanes MBTE, MTES and/or TEOS were mixed with EtOH and dil. HNO3, then cooked at 40 C. for 1 hr.
40 g of each mixture ("sol base") was added to 4.8 g 50% solution of surfactant "p104" in DPM.
Sol bases were mixed with 0.1 g 1% ethanolic dopant solution and 2 g DPM.
Silicon test chips were spun with these test sols at 1500 rpm for 90 s, then baked at 150 C. for 2 min.
Chips were annealed at 450 C. for 45 min. in N2 atmosphere.

| sol no. | sol base | wt sol base wt P104 | dopant | Tox. SB | TX 450 | n633 | shrinkage % | κ |
|---|---|---|---|---|---|---|---|---|
| Mp512-3 | Mp512-1 | 10 | TMANO | 601.0 | 542.3 | 1.241 | 9.77 | 1.975 |
| Mp512-4 | Mp512-2 | 10 | TMANO | 735.2 | 632.3 | 1.263 | 14 | 2.239 |
| Mp512-5 | Mp512-1 | 10 | 4-CPNO | 662.7 | 602.0 | 1.235 | 9.16 | 1.985 |
| Mp512-6 | Mp512-2 | 10 | 4-CPNO | 762.4 | 688.0 | 1.267 | 9.76 | 2.273 |
| Mp512-7 | Mp512-1 | 10 | QNO | 601.7 | 545.5 | 1.238 | 9.34 | 1.969 |
| Mp512-8 | Mp512-2 | 10 | QNO | 773.2 | 707.0 | 1.249 | 8.56 | 2.263 |
| Mp512-9 | Mp512-1 | 10 | IQNO | 590.1 | 531.3 | 1.239 | 9.96 | 1.955 |
| Mp512-10 | Mp512-2 | 10 | IQNO | 766.0 | 620.0 | 1.267 | 19.27 | 2.218 |
| Mp512-11 | Mp512-1 | 10 | 4-PNO | 544.9 | 486.7 | 1.242 | 10.68 | 1.997 |

TABLE 1-continued

| Mp512-12 | Mp512-2 | 10 | 4-PNO | 776.7 | 699.0 | 1.273 | 10 | 2.252 |
| Mp512-13 | Mp512-1 | 10 | 4-ABN | 629.0 | 553.4 | 1.235 | 12.02 | 1.954 |
| Mp512-14 | Mp512-2 | 10 | 4-ABN | 737.4 | 663.8 | 1.273 | 9.98 | 2.424 |
| Mp512-15 | Mp512-1 | 10 | 4-NA | 609.0 | 551.2 | 1.243 | 9.49 | 1.972 |
| Mp512-16 | Mp512-2 | 10 | 4-NA | 769.5 | 706.4 | 1.243 | 8.2 | 2.273 |
| Mp512-17 | Mp512-1 | 10 | Cs | 576.3 | 514.8 | 1.241 | 10.67 | 1.935 |
| Mp512-18 | Mp512-2 | 10 | Cs | 759.5 | 684.4 | 1.265 | 9.89 | 2.081 | answer key:
Cs = cesium, as CsNO3
TMANO = trimethylamine N-oxide
QNO = quinoline N-oxide
IQNO = isoquinoline N-oxide
DPM = dipropylene glycol monomethyl ether
MBTE = methylene bis(triethoxysilane)
MTES = methyltriethoxysilane
4-PNO = 4-picoline N-oxide
4-ABN = p-amino benzonitrile
4-NA = p-nitroaniline
4-CPNO = 4-cyanopyridine N-oxide
TEOS = tetraethyl orthosilicate
"p104" = BASF Pluronic P104 surfactant The relative effectiveness of a particular catalyst may furthermore be evaluated by preparing otherwise identical sol recipes with varying concentrations of catalyst. A typical dose-response curve shows that at very low values of catalyst concentration the k value is relatively high. The k value then decreases as the catalyst concentration increases, and eventually may rise again as the catalyst value becomes excessive.

A sol base is prepared by combining 2.45 g MBTE, 6.00 g TEOS, 6.42 g MTES and 17.5 g absolute ethanol. 8.34 g of a 0.01 N solution of nitric acid in water is added. This mixture is shaken and incubated at 40° C. for 1 hr. Test sols are made by combining 5.0 g of sol base with a 1% solution of trimethylamine N-oxide "TMANO" in ethanol and 0.80 g of a 50% solution of purified BASF Pluronic P104 in dipropylene glycol methyl ether (DPM). The Cs controls (sols 538-1 and 538-2) were made in the same way except that a 1% solution of Cs (as nitrate) in a 1:1 ethanol/water solution is used instead of TMANO.

A portion of cosolvent is then added; in this case it is 2.5 g of Dowanol DPM. The solutions are then filtered through 0.2 μm syringe filters, and spun onto silicon chips at 1500 rpm for 90 seconds. The chips are then baked at 150° C. for 2 minutes, then annealed (or "cured") at 450° C. for 45 minutes in a $N_2$ atmosphere. Composition and performance are shown in Table 2.

TABLE 2

| sol no. | dopant | [dopant] | wt dopant 1% soln | Tox, 150° | Tox 450° | n633 | κ |
|---|---|---|---|---|---|---|---|
| 538-1 | Cs | 100 | 0.05 | 669.7 | 598.8 | 1.210 | 1.96 |
| 538-2 | Cs | 200 | 0.1 | 641.9 | 574.9 | 1.212 | 1.82 |
| 538-3 | TMANO | 50 | 0.025 | 697.1 | 610.1 | 1.217 | 2.07 |
| 538-4 | TMANO | 100 | 0.05 | 735.5 | 662.3 | 1.216 | 2.04 |
| 538-5 | TMANO | 200 | 0.1 | 530.8 | 487.0 | 1.210 | 2.08 |
| 538-6 | TMANO | 300 | 0.15 | 618.4 | 569.2 | 1.211 | 1.99 |
| 538-7 | TMANO | 500 | 0.25 | 589.4 | 538.8 | 1.209 | 1.96 |
| 538-8 | TMANO | 1000 | 0.5 | 649.0 | 587.1 | 1.217 | 2.04 |

A plot of dielectric constant verse dopant concentration is shown in FIG. 1. The results are an example of dopant performance.

EXAMPLE 2

A sol base is prepared by combining 2.45 g MBTE, 6.00 g TEOS, 6.42 g MTES and 17.5 g absolute ethanol. 8.34 g of a 0.01 N solution of nitric acid in water is added. This mixture is shaken and incubated at 40° C. for 1 hr. Test sols are made by combining 5.0 g of sol base with a 1% solution of Michler's ketone "MK" in 1:1 ethanol/water and a 50% solution of purified BASF Pluronic P104 in dipropylene glycol methyl ether (DPM) in amounts indicated. The Cs controls (sols 539-1 and 539-2) were made in the same way except that a 1% solution of Cs (as nitrate) in a 1:1 ethanol/water solution is used instead of Michler's ketone.

Sols were diluted with 2.0 g DPM and spun onto conductive silicon chips at 1500 rpm for 90 s.

After spin, chips were soft baked at 150° C. for 5 min. Oxide thickness (Tox) and refractive index ($n_{633}$) were measured using a reflectometer. Chips were annealed at 475° C. in a $N_2$ atmosphere for 45 min. Dielectric constant (κ) was measured at 1 MHz using a Hg probe in a dot-ring configuration. Composition and performance are shown in Table 3.

TABLE 3

| sol no. | dopant | [dopant], ppm | wt (g) dopant 1% soln | Tox, nm 150° | Tox, nm 475° | n633 | κ |
|---|---|---|---|---|---|---|---|
| 539-1 | Cs | 100 | 0.05 | 788.8 | 708.2 | 1.204 | 1.863 |
| 539-2 | Cs | 200 | 0.1 | 800.1 | 718.6 | 1.202 | 1.852 |
| 539-3 | MK | 50 | 0.025 | 816.5 | 593.7 | 1.24 | 2.091 |
| 539-4 | MK | 100 | 0.05 | 794.8 | 608.7 | 1.229 | 2.237 |
| 539-5 | MK | 200 | 0.1 | 817.2 | 641.7 | 1.223 | 2.169 |
| 539-6 | MK | 300 | 0.15 | 783.8 | 630.8 | 1.216 | 2.124 |
| 539-7 | MK | 500 | 0.25 | 798.3 | 661 | 1.201 | 2.132 |
| 539-8 | MK | 1000 | 0.5 | 756.1 | 650.3 | 1.21 | 2.083 |

EXAMPLE 3

A sol base is prepared by combining 2.45 g MBTE, 6.00 g TEOS, 6.42 g MTES and 17.5 g absolute ethanol. 8.34 g of a 0.01 N solution of nitric acid in water is added. This mixture is shaken and incubated at 40° C. for 1 hr. Test sols are made by combining 5.0 g of sol base with a 1% or 5% solution of 1-ethyl-3-methyl-imidazolium dicyanamide "IM-DC" in ethanol and a 50% solution of purified BASF Pluronic P104 in dipropylene glycol methyl ether (DPM) in amounts indicated. The Cs controls (sols 559-1 and 559-2) were made in the same way except that a 1% solution of Cs (as nitrate) in a 1:1 ethanol/water solution is used instead of IM-DC. The sols are completed by adding 2.0 g DPM to each, then filtering through a 0.1 μm syringe filter.

Sols were diluted with 2.0 g DPM and spun onto conductive silicon chips at 1500 rpm for 90 s.

After spin, chips were soft baked at 150° C. for 5 min. Oxide thickness (Tox) and refractive index ($n_{633}$) were measured using a reflectometer. Chips were annealed at 475° C. in a $N_2$ atmosphere for 45 min. Dielectric constant (κ) was measured at 1 MHz using a Hg probe in a dot-ring configuration. Composition and performance are shown in Table 4.

TABLE 4

| sol no. | dopant | dopant conc. % | wt dopant soln | [dopant] ppm | Tox, 150° | Tox 450° | n633 | κ |
|---|---|---|---|---|---|---|---|---|
| Mp559-1 | Cs | 1 | 0.05 | 100 | 844.4 | 743.1 | 1.231 | 1.971 |
| Mp559-2 | Cs | 1 | 0.1 | 200 | 857.2 | 731.8 | 1.23 | 2.011 |
| Mp559-3 | IM-DC | 1 | 0.05 | 100 | 851.6 | 749.6 | 1.226 | 2.071 |
| Mp559-4 | IM-DC | 1 | 0.1 | 200 | 855.1 | 762.1 | 1.217 | 2.022 |
| Mp559-5 | IM-DC | 5 | 0.05 | 500 | 870.4 | 777.3 | 1.225 | 2.017 |
| Mp559-6 | IM-DC | 5 | 0.1 | 1000 | 866.7 | 779 | 1.224 | 1.996 |
| Mp559-7 | IM-DC | 5 | 0.2 | 2000 | 862.9 | 766 | 1.227 | 2.02 |
| Mp559-8 | IM-DC | 5 | 0.5 | 5000 | 816.5 | 714.9 | 1.231 | 2.032 |

EXAMPLE 4

Glycine betaine (trimethylglycine), a zwitterion, is also effective. In this example we test its performance with a sol containing both methyl-silicon and phenyl-silicon bonds. In addition two detergent templates are tested: BASF Pluronic P104 and Croda Brij s20.

A sol base is prepared by combining 2.72 g MBTE, 6.66 g TEOS, 5.70 g MTES, 1.92 g phenyltriethoxysilane (PTES) and 33.0 g absolute ethanol. 13.02 g of a 0.01 N solution of nitric acid in water is added. This mixture is shaken and incubated at 40° C. for 1 hr. Test sols are made by combining 5.0 g of sol base with 1% solutions of betaine or Cs (as nitrate) in 1:1 ethanol/water, 50% solutions of Pluronic P104 or Brij s20 in DPM. The sols are completed by adding 2.0 g DPM to each, then filtering through a 0.1 μm syringe filter.

Sols were diluted with 2.0 g DPM and spun onto conductive silicon chips at 1500 rpm for 90 s.

After spin, chips were soft baked at 150° C. for 5 min. Oxide thickness (Tox) and refractive index ($n_{633}$) were measured using a reflectometer. Chips were annealed at 450° C. in a $N_2$ atmosphere for 45 min. Dielectric constant (κ) was measured at 1 MHz using a Hg probe in a dot-ring configuration. Composition and performance are shown in Table 5. In this example, the results illustrate that performance of glycine betaine (and Cs) as a catalyst is roughly equivalent between the two detergent templates tested, Pluronic P104 and Brij s20.

TABLE 5

| Sol No | Dopant | [Dopant] in sol | Dopant wt | wt p104 1:1 DPM | Brij S20 1:1 DPM | Tox, 150° C. | Tox, 450° C. | n@633 | κ |
|---|---|---|---|---|---|---|---|---|---|
| 597-1 | betaine | 200 | 0.1 | 0.6 | 0 | 608.7 | 530 | 1.226 | 2.05 |
| 597-2 | betaine | 500 | 0.25 | 0.6 | 0 | 541.1 | 485.6 | 1.23 | 2.2 |
| 597-3 | betaine | 200 | 0.1 | 0.8 | 0 | 678.9 | 576.3 | 1.207 | 2.09 |
| 597-4 | betaine | 500 | 0.25 | 0.8 | 0 | 661.4 | 571.6 | 1.207 | 2.06 |
| 597-5 | 1% Cs | 180 | 0.1 | 0.6 | 0 | 567.7 | 504 | 1.227 | 1.93 |
| 597-6 | betaine | 200 | 0.1 | 0 | 0.6 | 510.8 | 431.8 | 1.235 | 2.2 |
| 597-7 | betaine | 50 | 0.25 | 0 | 0.6 | 481.9 | 409.2 | 1.231 | 2.07 |
| 597-8 | betaine | 200 | 0.1 | 0 | 0.8 | 561.6 | 449.9 | 1.216 | 2.06 |
| 597-9 | betaine | 500 | 0.25 | 0 | 0.8 | 548.6 | 437.6 | 1.216 | 1.94 |
| 597-10 | 1% Cs | 180 | 0.1 | 0 | 0.6 | 487.5 | 402.6 | 1.223 | 1.98 |

EXAMPLE 5

Reichardt's dye is another example of a betaine zwitterion. Here it is tested with Pluronic P104 and Brij s20 in two different base sols, one with PTES and the other without.

The first sol base, "145" is prepared by combining 2.45 g MBTE, 6.00 g TEOS, 6.42 g MTES, 17.5 g absolute ethanol. 8.34 g of a 0.01 N solution of nitric acid in water is added. This mixture is shaken and incubated at 40° C. for 1 hr. The second sol base, "1414" is prepared by combining 2.72 g MBTE, 6.66 g TEOS, 5.70 g MTES, 1.92 g phenyltriethoxysilane (PTES) and 33.0 g absolute ethanol. 13.02 g of a 0.01 N solution of nitric acid in water is added. This mixture is shaken and incubated at 40° C. for 1 hr. Test sols are made by combining 5.0 g of sol base with 1% solutions of Reichardt's dye ("RD") or Cs (as nitrate) in 1:1 ethanol/water, 50% solutions of Pluronic P104 or Brij s20 in DPM. The sols are completed by adding 2.0 g DPM to each, then filtering through a 0.1 μm syringe filter.

Sols were diluted with 2.0 g DPM and spun onto conductive silicon chips at 1500 rpm for 90 s.

After spin, chips were soft baked at 150° C. for 5 min. Oxide thickness (Tox) and refractive index ($n_{633}$) were measured using a reflectometer. Chips were annealed at 450° C. in a $N_2$ atmosphere for 45 min. Dielectric constant (κ) was measured at 1 MHz using a Hg probe in a dot-ring configuration. Composition and performance are shown in Table 6. In this example, while the k values of the Cs-containing films are substantially lower than those of the RD films, it is noted that the k values of the 500 ppm RD films are all lower than the 200 ppm RD films. This suggests that the optimum RD concentration in these sols is greater than 500 ppm.

TABLE 6

| sol no. | sol base | dopant | [dopant] in sol | template 1:1 in DPM | wt dopant 1% soln | Tox 150° | Tox 450° | n633 | κ |
|---|---|---|---|---|---|---|---|---|---|
| 600-1 | 145 | Cs | 200 | p104 | 0.1 | 751.8 | 665.9 | 1.203 | 1.89 |
| 600-2 | 145 | RD | 200 | p104 | 0.1 | 799.0 | 685.1 | 1.203 | 2.20 |
| 600-3 | 145 | RD | 500 | p104 | 0.25 | 773.8 | 692.1 | 1.202 | 2.15 |
| 600-4 | 145 | Cs | 200 | Brij s20 | 0.05 | 637.5 | 539.0 | 1.210 | 1.91 |
| 600-5 | 145 | RD | 200 | Brij s20 | 0.1 | 671.8 | 581.1 | 1.209 | 2.26 |
| 600-6 | 145 | RD | 500 | Brij s20 | 0.25 | 617.4 | 533.9 | 1.208 | 2.07 |
| 600-7 | 1414 | Cs | 200 | p104 | 0.1 | 641.4 | 546.3 | 1.194 | 1.81 |
| 600-8 | 1414 | RD | 200 | p104 | 0.1 | 609.9 | 522.8 | 1.200 | 2.15 |
| 600-9 | 1414 | RD | 500 | p104 | 0.25 | 562.5 | 501.3 | 1.190 | 2.12 |
| 600-10 | 1414 | Cs | 200 | Brij s20 | 0.05 | 535.3 | 412.7 | 1.204 | 1.91 |
| 600-11 | 1414 | RD | 200 | Brij s20 | 0.1 | 553.8 | 437.0 | 1.213 | 2.17 |
| 600-12 | 1414 | RD | 500 | Brij s20 | 0.25 | 538.9 | 438.8 | 1.214 | 2.12 |

EXAMPLE 6

It is possible to combine more than one catalyst to improve overall performance. The effect of the second catalyst may be additive, or it may be synergistic. The benefit of an additive catalyst is that it may still yield a k value lower than that available at any concentration of a single catalyst.

Two Catalysts Acting in an Additive Fashion

A sol base is prepared by combining 13.6 g MBTE, 33.3 g TEOS, 35.7 g MTES and 93.8 g absolute ethanol. 46.4 g of a 0.01 N solution of nitric acid in water is added. This mixture is shaken and incubated at 40° C. for 1 hr. Test sols are made by combining 10.0 g of sol base with 2% solutions of cyanamide ($NH_2CN$) and methyltriphenylphosphonium iodide ($Ph_3PMeI$) in the amounts indicated. Sols were completed by adding 2.0 g DPM and filtering through a 0.1 μm syringe filter.

Sols were diluted with 2.0 g DPM and spun onto conductive silicon chips at 1500 rpm for 90 s.

After spin, chips were soft baked at 150° C. for 5 min. Oxide thickness (Tox) and refractive index ($n_{633}$) were measured using a reflectometer. Chips were annealed at 400° C. in a $N_2$ atmosphere for 90 min. Dielectric constant (κ) was measured at 1 MHz using a Hg probe in a dot-ring configuration. Composition and performance are shown in Table 7.

The effect of the codopant is calculated as the sum of the k values of the 500 ppm $NH_2CN$ films minus the sum of the κ values of the 100 ppm $NH_2CN$ films:

Effect $NH_2CN = (\kappa_{681-16} + \kappa_{681-14}) - (\kappa_{681-13} + \kappa_{681-15}) = -0.26$ The effect of the interaction (i.e., synergy) between the dopant and codopant is calculated by subtracting the sum of the k values where both are 100 ppm from the k values where both are 50 ppm:

Interaction $= (\kappa_{681-16} + \kappa_{681-13}) - (\kappa_{681-14} + \kappa_{681-15}) = 0.04$ In this example, the results indicate that the effects of the dopant and codopant are likely additive, and neither synergistic nor antagonistic.

Two Catalysts Acting in an Synergistic Fashion

A sol base is prepared by combining 13.6 g MBTE, 33.3 g TEOS, 35.7 g MTES and 93.8 g absolute ethanol. 46.4 g of a 0.01 N solution of nitric acid in water is added. This mixture is shaken and incubated at 40° C. for 1 hr. Test sols are made by combining 10.0 g of sol base with 2% solutions of trimethyl glycine ("betaine") and 4,4'-bis(dimethylamino) benzophenone (Michler's ketone or "MK") in the amounts indicated. Sols were completed by adding 2.0 g DPM and filtering through a 0.1 μm syringe filter.

After spin, chips were soft baked at 150° C. for 5 min. Oxide thickness (Tox) and refractive index ($n_{633}$) were measured using a reflectometer. Chips were annealed at 400° C. for 90 min. in a $N_2$ atmosphere. Dielectric constant (κ) was measured at 1 MHz using a Hg probe in a dot-ring configuration. Composition and performance are shown in Table 8.

TABLE 7

| sol no. | dopant | wt dopant soln | [dopant] ppm | Tox, 150° | Tox 450° | n633 | κ |
|---|---|---|---|---|---|---|---|
| 680-7 | $Pph_3Me$ | 0.05 | 100 | 797.6 | 741.5 | 1.245 | 2.37 |
| 680-8 | $Pph_3Me$ | 0.25 | 500 | 786.8 | 722.9 | 1.251 | 2.3 |
| 680-15 | $NH_2CN$ | 0.05 | 100 | 777.9 | 712.5 | 1.257 | 2.63 |
| 680-16 | $NH_2CN$ | 0.25 | 500 | 767.4 | 702.5 | 1.242 | 2.36 |

Sols were then made by combining the two catalysts:

| | dopant | [dopant] ppm | codopant | [codopant] ppm | Tox, 150° | Tox 450° | n633 | κ |
|---|---|---|---|---|---|---|---|---|
| 681-13 | $Pph_3MeI$ | 100 | $NH_2CN$ | 100 | 783.1 | 727.6 | 1.242 | 2.42 |
| 681-14 | $Pph_3MeI$ | 100 | $NH_2CN$ | 500 | 770.8 | 713.5 | 1.246 | 2.27 |
| 681-15 | $Pph_3MeI$ | 500 | $NH_2CN$ | 100 | 751.3 | 695.3 | 1.255 | 2.34 |
| 681-16 | $Pph_3MeI$ | 500 | $NH_2CN$ | 500 | 757.8 | 707.9 | 1.245 | 2.23 |

The effect of the dopant is calculated as the sum of the k values of the 500 ppm $PPh_3MeI$ films minus the sum of the κ values of the 100 ppm $PPh_3MeI$ films:

Effect $PPh_3MeI = (\kappa_{681-15} + \kappa_{681-16}) - (\kappa_{681-13} + \kappa_{681-14}) = -0.12$ (this indicates that increasing $PPh_3MeI$ concentration reduces κ

TABLE 8

| sol no. | dopant | wt dopant soln | [dopant] ppm | Tox, 150° | Tox 450° | n633 | κ |
|---|---|---|---|---|---|---|---|
| 680-1 | betaine | 0.05 | 100 | 772.1 | 707.8 | 1.253 | 2.54 |
| 680-2 | betaine | 0.25 | 500 | 757.5 | 703.7 | 1.252 | 2.46 |
| 680-13 | MK | 0.05 | 100 | 784.9 | 735.7 | 1.250 | 2.51 |
| 680-14 | MK | 0.25 | 500 | 781.1 | 670.1 | 1.245 | 2.43 |

Sols were then made by combining the two catalysts:

| | dopant | [dopant] ppm | codopant | [codopant] ppm | Tox, 150° | Tox 450° | n633 | κ |
|---|---|---|---|---|---|---|---|---|
| 681-9 | betaine | 100 | MK | 100 | 760.4 | 695.5 | 1.243 | 2.43 |
| 681-10 | betaine | 100 | MK | 500 | 771.9 | 696.0 | 1.240 | 2.42 |
| 681-11 | betaine | 500 | MK | 100 | 767.9 | 706.3 | 1.251 | 2.36 |
| 681-12 | betaine | 500 | MK | 500 | 757.6 | 696.0 | 1.246 | 2.24 |

Calculations are:

Effect of betaine=$(\kappa_{681-11}+\kappa_{681-12})-(\kappa_{681-9}+\kappa_{681-10})=$ −0.25

Effect of Michler's ketone=$(\kappa_{681-12}+\kappa_{681-10})-(\kappa_{681-11}+\kappa_{681-9})=-0.13$ Interaction=$(\kappa_{681-12}+\kappa_{681-9})-(\kappa_{681-11}+\kappa_{681-10})=-0.11$ In this example, the results indicate that the effects of the dopant and codopant may be synergistic, though more data would be required to determine a confidence interval for the presence or absence of synergy.

EXAMPLE 7

In some applications it is desirable to reduce the amount of alkali metal catalyst (for example, Na, K, or Cs) but not eliminate it altogether. This usually occurs when the desired film dielectric constant is very low (k~2.1 or less) and a high Young's modulus "E" (~5 GPa) is preferred. In these cases it is possible to obtain low k and high E by combining an alkali metal ion with a nonmetallic catalyst.

To illustrate, six test sols were prepared by combining silicate esters and alkylated silicate esters with ethanol, acid and water in the usual fashion (Table 9).

The reagents were shaken and incubated at 40° C. for 1 hr. Test sols were made by combining 5.0 g aliquots of sol base with surfactant template (50% Pluronic P104 in DPM) with Cs (as nitrate) and TMANO solutions in ethanol/water. Sols were completed by adding 2.5 g of DPM to each, then filtering through 0.1 μm syringe filters. Sols were spun onto conductive silicon chips at 1500 rpm for 90 sec. After spin, chips were soft baked at 150° C. for 5 min. Oxide thickness (Tox) and refractive index ($n_{633}$) were measured using a reflectometer. Chips were annealed at 400° C. in a $N_2$ atmosphere for 90 min. Dielectric constant (κ) was measured at 1 MHz using a Hg probe in a dot-ring configuration. Composition and performance are shown in Table 10.

TABLE 9

| sol type | BTSE, g | TEOS, g | MTES, g | HNO₃, 0.01N | EtOH, g |
|---|---|---|---|---|---|
| 145 | 0.54 | 1.67 | 1.78 | 2.32 | 4.69 |
| 756 | 1.9 | 1.04 | 1.07 | 2.51 | 5.52 |
| 587 | 1.36 | 1.67 | 1.25 | 2.6 | 5.38 |
| 479 | 1.09 | 1.46 | 1.6 | 2.47 | 5.2 |

TABLE 9-continued

| sol type | TTSE, g | MBTE, g | TEOS, g | MTES, g | HNO₃, 0.01N | EtOH, g |
|---|---|---|---|---|---|---|
| 1405 | 0.52 | 1.36 | 0 | 0.89 | 1.5 | 3.68 |
| 1423 | 0.52 | 1.36 | 0.42 | 0.53 | 1.57 | 3.59 |

TABLE 10

| test sol | base sol | wt. p104 50% | wt. 1% TMANO | wt 0.1% Cs⁺ | [TMANO] ppm | [Cs] ppm |
|---|---|---|---|---|---|---|
| 628-7 | 145 | 0.6 | 0.2 | | 400 | |
| 628-8 | 756 | 0.7 | 0.2 | | 400 | |
| 628-9 | 587 | 0.7 | 0.2 | | 400 | |
| 628-10 | 479 | 0.65 | 0.2 | | 400 | |
| 628-11 | 1405 | 0.6 | 0.2 | | 400 | |
| 628-12 | 1423 | 0.6 | 0.2 | | 400 | |
| 628-13 | 145 | 0.6 | 0.2 | 0.05 | 400 | 10 |
| 628-14 | 756 | 0.7 | 0.2 | 0.05 | 400 | 10 |
| 628-15 | 587 | 0.7 | 0.2 | 0.05 | 400 | 10 |
| 628-16 | 479 | 0.65 | 0.2 | 0.05 | 400 | 10 |
| 628-17 | 1405 | 0.6 | 0.2 | 0.05 | 400 | 10 |
| 628-18 | 1423 | 0.6 | 0.2 | 0.05 | 400 | 10 |
| 628-13a | 145 | 0.6 | 0.2 | 0.25 | 400 | 50 |
| 628-14a | 756 | 0.7 | 0.2 | 0.25 | 400 | 50 |
| 628-15a | 587 | 0.7 | 0.2 | 0.25 | 400 | 50 |
| 628-16a | 479 | 0.65 | 0.2 | 0.25 | 400 | 50 |
| 628-17a | 1405 | 0.6 | 0.2 | 0.25 | 400 | 50 |
| 628-18a | 1423 | 0.6 | 0.2 | 0.25 | 400 | 50 |

| test sol | base sol | Tox, 150° | Tox, 450° | n633 | κ | E, Gpa |
|---|---|---|---|---|---|---|
| 628-7 | 145 | 637.3 | 581 | 1.235 | 1.99 | 3.97 |
| 628-8 | 756 | 792.2 | 690.3 | 1.228 | 2.10 | 4.49 |
| 628-9 | 587 | 769.9 | 683.6 | 1.220 | 2.03 | 4.18 |
| 628-10 | 479 | 716.9 | 643.3 | 1.228 | 2.08 | 3.99 |
| 628-11 | 1405 | 661.6 | 609.3 | 1.236 | 2.03 | 3.91 |
| 628-12 | 1423 | 685.7 | 627.4 | 1.238 | 2.18 | |
| 628-13 | 145 | 650.9 | 589.5 | 1.237 | 1.96 | 4.00 |
| 628-14 | 756 | 818.1 | 706.5 | 1.229 | 2.03 | 4.54 |
| 628-15 | 587 | 794.3 | 689.9 | 1.221 | 2.00 | 4.38 |
| 628-16 | 479 | 741.5 | 652.9 | 1.231 | 1.97 | 4.23 |
| 628-17 | 1405 | 685.1 | 630.3 | 1.237 | 1.95 | 3.96 |
| 628-18 | 1423 | 714.2 | 649.6 | 1.238 | 2.08 | |
| 628-13a | 145 | 614 | 558.4 | 1.242 | 1.96 | 4.09 |
| 628-14a | 756 | 771.6 | 673.1 | 1.237 | 2.03 | 4.72 |
| 628-15a | 587 | 742.3 | 654.4 | 1.231 | 2.00 | 4.52 |
| 628-16a | 479 | 697.5 | 620.9 | 1.237 | 2.00 | 4.27 |
| 628-17a | 1405 | 653.6 | 601.8 | 1.240 | 1.96 | 3.98 |
| 628-18a | 1423 | 661.6 | 606.5 | 1.251 | 2.06 | 5.44 |

The results in this example show that adding 10 ppm Cs had the effect of increasing E by 0.1 GPa and reducing average κ from 2.07 to 2.00. Adding an extra 40 ppm Cs had no effect on κ but increased average E by an additional 0.1

GPa. (E data from 628-18a are not included since corresponding E data for 628-12 and 628-18 were not available.)

Dielectric constant is not the only determinant of performance. Catalysts may also be tested in analogous fashion for their effect on the low-k films' Young's modulus, pore size distribution (PSD), resistance to damage from ash or etch ("delta k"), electrical leakage, and adhesion to the etch stop layer. It is noted that the shape of the plots of k vs. [catalyst], E vs. [catalyst], PSD vs. [catalyst], "delta k" vs. [catalyst], leakage vs. [catalyst] and adhesion vs. [catalyst] is not static and is expected to change as the sol ages. Moreover, the rate at which a sol ages, and the effect aging has on the plots of these determinants vs. [catalyst], will be influenced strongly by the temperature at which the sol is stored. In general, the effects of aging are significantly reduced by storing the sol at reduced temperature, particularly at 5° C. or lower.

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the invention and the following claims.

What is claimed is:

1. A sol composition for producing a porous low-k dielectric material, comprising:
    at least one silicate ester,
    a polar solvent,
    water,
    an acid catalyst for silicate ester hydrolysis,
    an amphiphilic block copolymer surfactant, and
    a nonmetallic catalyst that reduces dielectric constant in the produced material, provided that said nonmetallic catalyst is not a tertiary amine oxide,
        wherein the nonmetallic catalyst comprises glycine, betaine, arginine, 1,3-dimethylimidazolium 2-carboxylate, or nicotinic acid.

2. The composition of claim 1, further comprising a metallic ion at a lower parts-per-million concentration than the nonmetallic catalyst.

3. The composition of claim 1, further comprising a cosolvent.

4. A sol composition for producing a porous low-k dielectric material, comprising:
    at least one silicate ester,
    a polar solvent,
    water,
    an acid catalyst for silicate ester hydrolysis,
    an amphiphilic block copolymer surfactant, and
    a nonmetallic catalyst that reduces dielectric constant in the produced material, provided that said nonmetallic catalyst is not a tertiary amine oxide,
        wherein the nonmetallic catalyst comprises 1,3-dimethylimidazolium-2-carboxylate, glycine, betaine, arginine, or Reichardt's dye.

5. The composition of claim 1, wherein the nonmetallic catalyst is stable to at least 130° C.

6. The composition of claim 1, wherein the nonmetallic catalyst is at a concentration of between 1 ppm-20,000 ppm.

7. The composition of claim 1, wherein the nonmetallic catalyst is stable in water and/or an alcohol at a temperature of ≥80° C.

8. The composition of claim 1, wherein the nonmetallic catalyst is stable in the presence of an organic silicate in solution.

9. The composition of claim 1, wherein the at least one silicate ester is tetraethyl orthosilicate, the polar solvent is a $C_{1-4}$ alcohol, and the amphiphilic block copolymer surfactant is a poly(ethylene oxide)-poly(propylene oxide)-poly(ethylene oxide) polymer.

10. The composition of claim 1, wherein the at least one silicate ester is:
    bis(triethoxysilyl)ethane; 1,1,2-tris(triethoxysilyl) ethane; tris(triethoxysilyl)methane; TEOS; MTES; MBTE; or phenyltriethoxysilane (PTES); or a combination thereof.

11. A method of preparing a thin film on a substrate, comprising
    treating a substrate by depositing the sol composition of claim 1 onto the substrate;
    baking and annealing the treated substrate to form a film.

12. The composition of claim 1, wherein the nonmetallic catalyst is at a concentration of between 10 ppm-2,000 ppm.

13. The composition of claim 4, further comprising a metallic ion at a lower parts-per-million concentration than the nonmetallic catalyst.

14. The composition of claim 4, further comprising a cosolvent.

15. The composition of claim 4, wherein the nonmetallic catalyst is stable to at least 130° C.

16. The composition of claim 4, wherein the nonmetallic catalyst is at a concentration of between 1 ppm-20,000 ppm.

17. The composition of claim 4, wherein the nonmetallic catalyst is at a concentration of between 10 ppm-2,000 ppm.

18. The composition of claim 4, wherein the nonmetallic catalyst is stable in water and/or an alcohol at a temperature of ≥80° C.

19. The composition of claim 4, wherein the nonmetallic catalyst is stable in the presence of an organic silicate in solution.

20. The composition of claim 4, wherein the at least one silicate ester is tetraethyl orthosilicate, the polar solvent is a $C_{1-4}$ alcohol, and the amphiphilic block copolymer surfactant is a poly(ethylene oxide)-poly(propylene oxide)-poly(ethylene oxide) polymer.

21. The composition of claim 4, wherein the at least one silicate ester is:
    bis(triethoxysilyl)ethane; 1,1,2-tris(triethoxysilyl) ethane; tris(triethoxysilyl)methane; TEOS; MTES; MBTE; or phenyltriethoxysilane (PTES); or a combination thereof.

* * * * *